United States Patent
Kumar et al.

(10) Patent No.: US 8,586,151 B2
(45) Date of Patent: Nov. 19, 2013

(54) PROCESS FOR THE PREPARATION OF PHOTOLUMINESCENT NANOSTRUCTURED SILICON THIN FILMS USING RADIO FREQUENCY PLASMA DISCHARGE

(75) Inventors: Sushil Kumar, New Delhi (IN); Prakash Narain Dixit, New Delhi (IN); Chandra Mohan Singh Rauthan, New Delhi (IN)

(73) Assignee: Council of Scientific & Industrial Research, New Delhi (IN)

( * ) Notice: Subject to any disclaimer, the term of this patent is extended or adjusted under 35 U.S.C. 154(b) by 708 days.

(21) Appl. No.: 12/810,920

(22) PCT Filed: Jun. 13, 2008

(86) PCT No.: PCT/IN2008/000371
§ 371 (c)(1),
(2), (4) Date: Jun. 28, 2010

(87) PCT Pub. No.: WO2009/084005
PCT Pub. Date: Jul. 9, 2009

(65) Prior Publication Data
US 2010/0285235 A1    Nov. 11, 2010

(30) Foreign Application Priority Data
Dec. 28, 2007 (IN) ............ 2750/DEL/2007

(51) Int. Cl.
*C23C 16/24* (2006.01)
(52) U.S. Cl.
USPC ............. 427/574; 427/578; 427/294
(58) Field of Classification Search
USPC ................... 427/569, 574, 578, 294
See application file for complete search history.

(56) References Cited

U.S. PATENT DOCUMENTS

| | | | | |
|---|---|---|---|---|
| 5,962,863 | A * | 10/1999 | Russell et al. | 257/14 |
| 6,309,906 | B1 * | 10/2001 | Meier et al. | 438/69 |
| 6,554,870 | B1 * | 4/2003 | Cotteret et al. | 8/405 |
| 2005/0120956 | A1 * | 6/2005 | Suzuki | 118/719 |

OTHER PUBLICATIONS

Edelberg, Erik, et al., "Visible luminescence from nanocrystalline silicon films produced by plasma enhance chemical vapor deposition". Appl. Phys. Lett. 68 (10), Mar. 4, 1996, pp. 1415-1417.*
Yang, D.-Q, et al., "Photoluminescence of highly porous nanostructured Si-based thin films deposited by pulsed laser ablation". Journal of Applied Physics 98, 024310 (2005), pp. 1-8.*
Estes, M.J., et al., "Luminescence from amorphous silicon nanostructures". Physical Review B, vol. 54, No. 20, Nov. 15, 1996—II, 14633-14642.*
Cavarrac, Marjorie, et al., "Nanostructured Silicon Thin Films Deposited Under Dusty Plasma Conditions". IEEE Transactions on Plasma Science, vol. 36, No. 4, Aug. 2008, pp. 1016-1017.*
Detty, A.P., et al., "Preparation and characterization studies of nanostructured silicon thin films using rf magnetron sputtering". International Seminar on Science and Technology of Glass Materials, IOP Conf. Series: Materials Science and Engineering 2 (2009) 012039, pp. 1-4.*

* cited by examiner

*Primary Examiner* — Bret Chen
(74) *Attorney, Agent, or Firm* — Ladas & Parry LLP

(57) ABSTRACT

A process for the preparation of nano structured silicon thin film using radio frequency (rf) plasma discharge useful for light emitting devices such as light emitting diode, laser etc. which allows precise control of the nanocrystal size of silicon and its uniform distribution without doping using a plasma processing for obtaining efficient photoluminescence at room temperature.

10 Claims, No Drawings

PROCESS FOR THE PREPARATION OF PHOTOLUMINESCENT NANOSTRUCTURED SILICON THIN FILMS USING RADIO FREQUENCY PLASMA DISCHARGE

FIELD OF THE INVENTION

The present invention relates to a process for the preparation of nano structured silicon thin film. More particularly, the present invention relates to a process for the preparation of nano structured silicon thin film using radio frequency (rf) plasma discharge useful for light emitting devices such as light emitting diode, laser etc.

BACKGROUND OF THE INVENTION

Silicon has shown dominance over other materials over the years but, because of its indirect band gap nature, it was believed that it cannot find use in photonic devices. However, very recently there were some successes to make light emitting diodes and Laser using nano-silicon. References in this connection may be made to M. A. Green, J Zhao, A Wang, P J Reece, and M GAL in Nature 412, 805 (2001) and also L. Pavesi L Dal Negro, G Mazzoleni, G Franzo and F Priola in Nature 408, 440 (2000).

The properties of silicon undergo significant changes when the crystallite size reaches the range of a few nanometers. The nanometer-scale size of these crystals leads to novel electronic and optical properties associated with quantum confinement and single-electron charging effects. Because of their technological applications such nanocrystalline silicon are receiving increasing attention. It appears now that nanocrystalline silicon could provide the alternate to other direct band gap semiconductors, e.g., gallium arsenide and indium phosphide that are good at emitting light but are more expensive than silicon. The properties of nanocrystalline silicon have also been exploited for the fabrication of various other devices such as single-electron transistors and memories for which references may be made to K. Yano, T. Ishii, T. Hashimoto, T. Kobauashi, F. Murai, and K. Seki in Appl. Phys. Lett. 67, 828 (1995) and Y. T. Tan, T. Kamiya, Z. A. K. Durrani, and H. Ahmed, in J. Appl. Phys. 94, 633 (2003); electron emitters for which reference may be made to K. Nishiguchi, X. Zhao, and S. Oda in J. Appl. Phys. 92, 2748 (2002); field effect electroluminescence for which reference may be made to K. Nishiguchi, X. Zhao, and S. Oda in J. Appl. Phys. 2, 2748 (2002).

In recent years, there has been great interest in silicon nanocrystals prepared by various growth techniques. References may be made to K. Yano, T. Ishii, T. Hashimoto, T. Kobauashi, F. Murai, and K. Seki in Appl. Phys. Lett. 67, 828 (1995); G. F. Grom, D. J. Lockwood, J. P. McCaffery, N. J. Labbe, P. M. Fauchet, B. White, Jr., J. Diener, D. Kovalev, F. Koch, and L. Tsybeskov in Nature 407, 358 (2000); S. Oda and M. Otobe in Mater. Res. Soc. Symp. Proc. 358, 721 (1995); T. Kamiya, K. Nakahata, Y. T. Tan, Z. A. K. Durrani, and I. Shimuzu in J. Appl. Phys. 89, 6265 (2001). It has been shown that porous silicon prepared by anodic etching of silicon wafers in an HF/ethonal/water solution, with a crystallite size of few nanometers shows an efficient photoluminescence. References may be made to L. T. Canham in Appl. Phys. Lett. 57, 1046 (1990); V. Lehmann and U. Gosels in Appl. Phys. Lett. 58, 856 (1991). However, there is disadvantage of porous silicon like its brittleness, high porosity and a relatively poor control of the crystallite size, which are major hindrance to use it for devices. Whereas, the possibility of precise control of the nanocrystal size and separation by plasma decomposition of $SiH_4$ as described by Y. Kanemitsu, S. Okamoto, M. Otobe, and S. Oda in Phys. Rev. B 55, R7375 (1997) and also by S. Oda and M. Otobe in Mater. Res. Soc. Symp. Proc. 358, 721 (1995) using plasma CVD technique raises the possibility of large numbers of nanocrystal devices with well-defined electrical and optical characteristics. Demand for large area electronics is possible by plasma processing which is an expanding field for microelectronics, optoelectronic and photonic, particularly on the use of capacitively coupled radio-frequency glow discharge technique. Now a days plasma CVD technique is capable of a uniform deposition on glass plates with sizes above 1 $m^2$. There is report about plasma production of nanocrystalline silicon particles and polymorphous silicon thin films for large area electronics devices by P. R. Carbarrocas, A. F. Morral, S. Lebib and Y. Poissnat, Pure Appl. Chem, 74, 359 (2002).

Silane ($SiH_4$) plasmas have been widely studied with respect to the plasma processes (primary and secondary reactions), the plasma/surface interactions, the film growth mechanisms for hydrogenated amorphous silicon (a-Si:H) properties as described by R. A. Street in Hydrogenated Amorphous Silicon, Cambridge University Press, Cambridge (1991). Such amorphous silicon thin films (a-Si:H) are the basis of a large number of devices. Indeed, despite the disordered nature of this semiconductor, its electronic properties are good enough to produce electronic devices such as solar cells, thin-film transistors for active matrix liquid crystal displays, photo and particle detectors, etc. References may be made to Proceedings of the Symposium on Thin Films for Large Area Electronics, E-MRS 2000 published in Thin Solid Films, Vol. 383 (2001). Nevertheless, further improvement of the performances of these devices will require a reduction in the density of defects of the material-related to a reduction of its disorder as well as to enhance its stability. For example, a-Si:H solar cells suffer from the creation of metastable defects upon recombination of photogenerated electrons and holes, which results in a 20 to 30% reduction in the cell efficiency when submitted to prolonged exposure to light. Nanocrystalline silicon could be a answer to the problem faced by hydrogenated amorphous silicon. It has been shown that hydrogenated nanocrystalline silicon (nc-Si:H) films are more stable during light soaking than amorphous silicon as described by J. Meier, R. Fluckiger, H. Keppner, A. Shah in Appl. Phys. Lett. 65, 860 (1994). There is a study by Orpella, C. Voz, J. Puigodollers, D. Dosev, M. Fonrodona, D. Soler, J. Bertomeu, J. M. Asensi. J. Andreu, R. Alcubila in Thin Solid Films, 395, 335 (2001) which shows that thin film transistors (TFT's) made of nc-Si:H show more stability than amorphous silicon TFTs under prolonged times of gate bias stress. However, here it is emphasized nanocrystalline silicon as light emitting material.

Among the various semiconductor materials that have been used to fabricate photonic devices like light emitting diode or lasers, the absence of silicon is striking. The common belief that bulk silicon cannot be a light-emitting material has been severely questioned thus, one naturally wonders why silicon has not been used as a photonic devices. Actually, reasons are associated with the fundamental properties of silicon. Silicon is an indirect band gap material. Light emission is via a phonon-mediated process with low probabilities: Spontaneous recombination lifetimes are in the millisecond range. In standard bulk silicon, competitive nonradiative recombination rates are much higher than the radiative ones, and more of the excited electron-hole pairs recombine nonradiatively. This yields very low internal quantum efficiencies for bulk silicon luminescence. The ability of a material to emit light is usually quantified by the internal quantum efficiency $\eta_{int}$, which is the ratio of the probability that an excited electron-hole pair recombine radiatively to the probability of electron-hole pair recombination. In electronic grade silicon the internal quantum efficiency $\eta_{int}$ is $\sim 10^{-6}$. Nonradiative recombination is more efficient than radiative which is the reason why silicon is a poor luminescent material. In addition, fast nonradiative processes such as Auger or free-carrier adsorption prevent population inversion for silicon optical transitions at the high pumping rates needed to achieve optical amplification for laser action. Many strategies have been researched over the years to overcome this limitation, mostly by spatial localization of carriers to decrease the encounter probability with luminescence killer centers. References may be made to L. Pavesi in J. Phys.: Condens. Matter 15, R1169 (2003); L. Pavesi in Materials Today, 18 (2005); P. M. Fauchet in Materials Today, 26 (2005); K. P. Homewood and M. A. Lorenco in Materials Today, 34 (2005).

Hydrogenated amorphous silicon is a single-phase material whereas nanocrystalline silicon (nc-Si:H) can be described as a bi-phasic material consisting of a dispersion of silicon nanocrystals embedded in a matrix of hydrogenated amorphous silicon (a-Si:H). The volume fraction of two phases in nc-Si:H could be varied by selecting the proper preparation conditions. In both phases, a certain amount of hydrogen is dissolved, whose concentration depends as well on the deposition conditions.

Amorphous and nanocrystalline silicon have different electronic and optical properties, and this makes them suitable for different applications. Both types of silicon are made by depositing silicon from plasma of silane that is $SiH_4$ on to a substrate. This plasma deposition technique is straightforward for amorphous silicon but more complicated for nanocrystalline silicon. Normally it is believe that hydrogen from the silane plays an important role in this process, it has been unclear exactly how the two kinds of silicon are related. Recently S. Siraman, S. Agarwal, E. S. Aydil, D. Marodas in Nature 418, 62 (2002) have established that the hydrogen atoms can rearrange the atoms in amorphous silicon into the lattice structure found in nanocrystalline silicon. The researchers proposed that the hydrogen atoms get trapped between loosely bound atoms in amorphous silicon to make a higher energy Si—H—Si configuration. When the hydrogen atoms are later released, they proposed, the silicon atoms would be left in ordered, nanocrystalline array. To test their theory they also used molecular dynamics simulation to show how the deposition process would proceed. They also deposited silicon films from silane plasma in which some of the hydrogen was replaced by deuterium. Structure of nanocrystalline silicon was simulated by R. Biswas and B. C. Pan, NPEL/CD-520-3358, Page 803, NCPV and Solar Program Review Meeting 2003. Biswas's molecular dynamics simulation also shows a mixed-phase material that consists of clusters of nanocrystalline silicon embedded in an amorphous matrix.

Sheets of nanocrystalline silicon are easier and cheaper to make similar to amorphous silicon, so this form has also wide scope for applications where large areas of silicon are needed, including display and solar cells. Moreover, stability is added advantage to nanocrystalline silicon. nc-Si:H has already been demonstrated to be an alternative material to amorphous silicon in photovoltaic applications, with a conversion efficiency of 10.9% in a p-i-n structure type cell configuration as described by A. V. Shah, J. Meier, E. Vallat-Sauvain, U. Kroll, N. Wyrsch, J. Guillet, U. Graf in Thin Solid Films 403, 179 (2002). This is because there is a great advantage of optical properties (low absorption and higher bandgap) in nc-Si:H films as described by Y. He, C. Yin, L. Wang, X. Liu, G. H. Hu, J. Appl. Phys. 75, 797 (1994)] than those of a-Si:H and crystalline silicon (c-Si) in the solar spectrum range. Use of nc-Si:H in photovoltaic is not the only possible technological application, but there is also a great potential for optoelectronics applications. Its structure is considered to be as a dispersion of silicon quantum dots in an amorphous matrix, which turn out to higher band gap material, and easily integral in a silicon chip and fully compatible with the today's microelectronic processes. This is in accordance with the previously reported theoretical studies where it has been mentioned that the quantum confinement effect enlarges the band gap of nanocrystallites as described by Vasiliev, S. Ogut, J. R. Chelikowsky in Phys. Rev. Lett. 86, 1813 (2001), increasing the oscillator strength giving rise to efficient and visible luminescence.

At least in principle optical properties of nc-Si:H might be tuned by controlling the surface rate of the chemical reaction during deposition via a proper selection of the process conditions, with interesting opportunities for the light emitting diode technology as described by S. Binett, M. Acciarri, M. Bollani, L. Fumagalli, H. V. Kanel, S. Pizzine in Thin Solid Films 487, 19 (2005).

There are many methods of producing silicon nano-crystallities, which show photoluminescence, and their efficiency depends upon how the bulk or surface defects from such nano crystallites are removed or passivated. Nano crystalline films grown by plasma enhanced chemical vapour deposition (PECVD) containing silicon, oxygen and nitrogen which is described by M. Ruckschloss et al. in J. Lumin 57, 1 (1993) and by M. V. Wolkin et al. in Phys. Rev. Lett. 82, 197 (1999); Annealed silicon rich silicon oxide films produced by ion implanting silicon atoms into silicon dioxide which is described by K. S. Min, K. V. Shcheglov, C. M. Yang, Harry A. Atwater, M. L. Brongersma and A. Polman in Appl. Phys. Lett. 69, 2033 (1996); Multilayers films prepared by annealing amorphous $Si/SiO_2$ supper lattices which is described by L. Tsybekov K. D. Hirschman, S. P. Duttagupta, M. Zacharias, and P. M. Fauchet, J. P. McCaffrey and D. J. Lockwood in Appl. Phys. Lett. 72, 43 (1998) and porous silicon which is described by R. T. Coolns et al. in Physics Today 50, 24 (January 1997); P. M. Fauchet and Von Behren in J. Phys. Status Solidi B 204, R7 (197), all these nanostructure show photoluminescence. L. Diehl et al. in Appl. Phys. Lett. P4700 (December 2002) have shown electroluminescence from strain compensated $Si_{0.2}Ge_{0.8}$/Si quantum cascade structures. Radiative transitions is also observed in Er coupled silicon nanoclusters by G. Franzo et. al. in J. Appl. Phys. 81, 2784 (1997). The origin of the luminescence in nanocrystalline silicon may be from two reasons:

(i) confined excition recombination in nanocrystallites of silicon as described by J. Heitmann et al. in Phys. Rev. B 69, 195309 (2004), (ii) from defect assisted recombination mechanism as described by L. Khriachtchev et al. in J. Appl. Phys. 86, 5601 (1999); L. Khriachtchev, M. Rasanen, S. Novikov and L. Pavesi in Appl. Phys. Lett. 85, 1511 (2004)].

In the defect assisted mechanism luminescence is the result of the recombination of carriers trapped at radiative recombination centers that form at the interface between nc-Si and the dielectric or even in the dielectric itself as described by L. Pavesi in Materials Today, 18 (2005); P. M. Fauchet in Materials Today, 26 (2005).

Inventors have observed photoluminescence at room temperature in nc-Si:H films grown by PECVD technique using $SiH_4$ and Ar gaseous discharge. The structure of films may be visualized as nc-Si:H structures embedded in amorphous silicon matrix. In other words nc-Si:H in a-Si:H is as small nanoclusters dispersed in a dielectric matrix. Here a-Si:H can be considered as dielectric because a-Si:H is highly-resistive to nc-Si:H.

Nano structured silicon could provide the alternate to other direct band gap semiconductors, e.g., gallium arsenide and indium phosphide that are good at emitting light but are more expensive than silicon. Porous silicon also known as nanocrystalline silicon emit light but having drawbacks like its brittleness, high porosity and a relatively poor control of the crystallite size, which are major hindrance for its use for devices. Other silicon based light emitting materials like silicon oxide or $Si/SiO_2$ supperlattice structures, SiGe/Si quantum structures, Er coupled silicon nanoclusters are not pure materials. These require doping or complex multilayer structures. Whereas, the possibility of precise control of the nanocrystal silicon size and its separation by plasma decomposition of $SiH_4$ using plasma CVD technique have possibility of making efficient light emitting devices. Moreover, nc-S:H growth by plasma CVD technique is capable of a uniform deposition over large area glass or flexible substrates.

The main objective of the present invention is to provide a process to make photo luminescent nanostructured silicon thin films which obviates the drawbacks of the hitherto known prior art as detailed above.

A novel deposition process has been developed by the inventors to deposit photo luminescent nano structured silicon thin films using plasma enhanced chemical vapour deposition (PECVD) technique which is accomplished through the appropriate selection of various process parameters such as power density, chamber pressure, gas flow rates, temperature etc. Photoluminescence in these nano structured silicon thin films are observed at room temperature. In this process there is no use of doping to obtain photoluminescence. In this process it was found that films deposited under a set of deposition parameters were nanocrystalline in nature and shows photoluminance, which were grown using gaseous mixture of silane ($SiH_4$) diluted in hydrogen ($H_2$), and argon (Ar) in a radio frequency (13.56 MHz) plasma enhanced chemical vapour deposition system. Process parameters were varied and optimized to enhance the growth of nanocrystalline phases embedded in amorphous matrix of silicon. These films were characterized for structural properties using X-ray diffraction (XRD), Scanning electron microscopy (SEM), atomic force microscopy (AFM) and Laser Raman techniques. Films were also characterized for estimation of optical bandgap and electrical conductivity.

Among the various semiconductor materials that have been used to fabricate photonic devices like light emitting diode or lasers, the absence of silicon is striking. The common belief that bulk silicon cannot be a light-emitting material has been severely questioned thus, one naturally wonders why silicon has not been used as a photonic devices. Actually, reasons are associated with the fundamental properties of silicon. Silicon is an indirect band gap material. The properties of silicon undergoes significant changes when the crystallite size reaches the range of a few nanometers and start emitting light. Because of their technological applications such nanocrystalline silicon are receiving increasing attention. It appears now that nanocrystalline silicon could provide the alternate to other direct bandgap semiconductors, e.g., gallium arsenide and indium phosphide that are good at emitting light but are more expensive than silicon. Inventors have grown photo luminescent nano structured silicon films on glass and silicon substrates using plasma enhanced chemical vapour deposition technique, which could be useful for making of electroluminance based devices like light emitting diode and LASER.

OBJECTIVES OF THE INVENTION

The main object of the invention is to provide a process for the preparation of nanostructured silicon thin film.

Another object of the present invention is to provide a process for the preparation of controlled uniform nanostructured silicon film useful for light emitting devices.

Yet another object is to provide a cost effective process for the deposition of nanostructured silicon on large area of the substrate.

SUMMARY OF THE INVENTION

Accordingly the present invention provides a process for the preparation of photo luminescent nanostructured silicon thin films and the said process comprising the steps of:
  (i) cleaning the substrate by known method and placing it on an anode in a plasma enhanced chemical vapour deposition (PECVD) chamber,
  (ii) pumping the above said PECVD chamber to a base pressure of $10^{-7}$ to $10^{-8}$ torr to remove the residual gases,
  (iii) heating the substrate at a temperature in the range of 180-250° C.,
  (iv) depositing the nano structured silicon thin film over the substrate by feeding the hydrogen diluted silane gas ($SiH_4$) at a rate of 30-50 standard cubic centimeter (sccm) and argon gas at a partial pressure of 30-90%, to the above said PECVD chamber, for a period of 10-60 minutes, at a chamber pressure of 0.5-10 torr,
  (v) applying a radio frequency of 13.56 MHz to a cathode in the above said PECVD chamber, at a power density of 100-1000 $mW/cm^2$,
  (vi) cooling the above said PECVD chamber to a temperature of 25-30° C., followed by breaking of vacuum by inserting the nitrogen gas to obtain the desired nano structured silicon film.

In an embodiment of the present invention the substrate used in step (i) is selected from the group consisting of glass, silicon, transparent conducting oxides coated glass and metals and the heating temperature of the substrate used is preferably in the range of 200-220° C.

In another embodiment of the present invention the heating temperature of the substrate used is preferably in the range of 200-220° C.

In another embodiment the hydrogen diluted silane used in present invention is in the range of 5-10% silane in hydrogen.

In yet another embodiment the rate of feeding of hydrogen diluted silane used in step (iv) is preferably in the range of 38-42 sccm.

In yet another embodiment the partial pressure of argon gas used is preferably in the range of 45-65%.

In yet another embodiment the chamber pressure used in step (iv) is preferably in the range of 2-4 torr.

In yet another embodiment the power density used in step (v) is preferably in the range of 750-850 $mW/cm^2$.

In yet another embodiment the depositing rate of thin silicon film over the substrate is in the range of 1-5 A°/sec.

In yet another embodiment thin silicon film obtained have the average particle size distribution in the range of 5-20 nm.

In still another embodiment the nanostructured silicon thin film obtained have a band gap and a photo luminescence in the range of 2-2.4 eV and 2.1-2.9 eV, respectively.

DETAIL DESCRIPTION OF THE INVENTION

The purpose of the present invention is to provide a process to make photo luminescent nanostructured silicon thin films which comprises the appropriate selection of various process parameters such as power density, chamber pressure, gas flow rates, temperature etc. The nanostructured thin film is deposited over a substrate by feeding gaseous mixture of silane ($SiH_4$) diluted in hydrogen ($H_2$), and argon (Ar) in a radio frequency (13.56 MHz) plasma enhanced chemical vapour deposition system at relatively lower substrate temperature (around 200° C.) to obtain optimum nanostructures phases embedded in amorphous matrix of silicon films on substrates (glass and silicon wafer) over 100 $cm^2$. The films obtained by this method show photoluminescence (PL) at room temperature and these photoluminescence peak positions depends upon the process parameters of the deposited films and the PL peak position shifts. For example from 2.18 eV (569 nm) to 2.94 eV (421 nm) with the increase of argon dilution (Blue shift) in nc-Si:H films and the PL spectra confirm the high band gap (more than 2 eV) obtained in these films, which are estimated by Tauc's plot using transmission and reflectance measurement.

The present invention provides a process for the preparation of photo luminescent nanostructured silicon thin films and the said process comprising the steps of:
  (i) cleaning the substrate by known method and placing it on an anode in a plasma enhanced chemical vapour deposition (PECVD) chamber,
  (ii) pumping the above said PECVD chamber to a base pressure of $10^{-7}$ to $10^{-8}$ torr to remove the residual gases,
  (iii) heating the substrate at a temperature in the range of 180-250° C.,
  (iv) depositing the nano structured silicon thin film over the substrate by feeding the hydrogen diluted silane gas ($SiH_4$) at a rate of 30-50 standard cubic centimeter (sccm) and argon gas at a partial pressure of 30-90%, to the above said PECVD chamber, for a period of 10-60 minutes, at a chamber pressure of 0.5-10 torr,
  (v) applying a radio frequency of 13.56 MHz to a cathode in the above said PECVD chamber, at a power density of 100-1000 $mW/cm^2$,
  (vi) cooling the above said PECVD chamber to a temperature of 25-30° C., followed by breaking of vacuum by inserting the nitrogen gas to obtain the desired nano structured silicon film.

In an embodiment of the present invention the substrate used in step (i) is selected from the group consisting of glass, silicon, transparent conducting oxides coated glass and metals and the heating temperature of the substrate used is preferably in the range of 200-220° C.

In another embodiment of the present invention the heating temperature of the substrate used is preferably in the range of 200-220° C.

In another embodiment the hydrogen diluted silane used in present invention is in the range of 5-10% silane in hydrogen.

In yet another embodiment the rate of feeding of hydrogen diluted silane used in step (iv) is preferably in the range of 38-42 sccm.

In yet another embodiment the partial pressure of argon gas used is preferably in the range of 45-65%.

In yet another embodiment the chamber pressure used in step (iv) is preferably in the range of 2-4 torr.

In yet another embodiment the power density used in step (v) is preferably in the range of 750-850 $mW/cm^2$.

In yet another embodiment the depositing rate of thin silicon film over the substrate is in the range of 1-5 A°/sec.

In yet another embodiment thin silicon film obtained have the average particle size distribution in the range of 5-20 nm.

In still another embodiment the nanostructured silicon thin film obtained have a band gap and a photo luminescence in the range of 2-2.4 eV and 2.1-2.9 eV, respectively.

According to one of the feature of the process the nanostructured silicon films were grown over 100 $cm^2$ area in a plasma enhanced chemical vapour deposition (PECVD) system. This is a parallel plate capacitively coupled PECVD system.

In another feature the substrate was placed on ground electrode and RF power (13.56 MHz) was applied to cathode electrode.

In the present invention RF power was kept higher than normally used to deposit a-Si:H films by PECVD technique.

In the present invention deposition parameters such as gas flow, pressure, power density, temperature etc. were varied to get maximum nanocrystalline silicon phases in films. These films were characterized by small angle X-Ray Diffraction (XRD), Scanning Electron Microscopy (SEM), Photoluminescence (PL) and Laser Raman techniques. All these measurements confirm nano-crystallinity in films and shown high bandgap compared to normally observe in hydrogenated amorphous silicon films.

SEM and AFM images of nc-Si:H films were recorded. These images show the cluster of nanocrystalline silicon grains embedded in amorphous silicon matrix. The cluster size was found to be in the range 30-100 nm. Films deposited at high RF power and high argon dilution were found to be with more nano structures. Under certain process parameters density of nanostructures increases and looks like these structures are agglomerate. Inventors have also performed grain distribution analysis by SPIP using data generated from AFM images of nc-Si:H film. Grain sizes of these images were estimated to be in the range of 10-50 nm. Films deposited at 1000 $mW/cm^2$ powers clearly reveals that there are small grains embedded in larger grain. With the increase of applied power from 600 $mW/cm^2$ to 1000 $mW/cm^2$ the smaller grains forms into clusters that is they get agglomerate. In conclusion, the smaller clusters of nanocrystalline silicon grains are bound together and formed into larger grain and all these are embedded amorphous matrix.

Inventors have observed photoluminescence at room temperature in nc-Si:H films grown by PECVD technique using $SiH_4$ and Ar gaseous discharge. The structure of films may be visualized as nc-Si:H structures embedded in amorphous silicon matrix. In other words nc-Si:H in a-Si:H is as small nanoclusters dispersed in a dielectric matrix. Here a-Si:H can be considered as dielectric because a-Si:H is highly resistive to nc-Si:H. Device quality a-Si:H films are normally deposited at low power density (less than 100 $mW/cm^2$). However, this nc-Si:H films are deposited at high power density (in the range of 200 $mW/cm^2$-1000 $mW/cm^2$) in a PECVD system. Inventors emphases here that these films are more or less similar to nanocrystalline silicon dispersed in amorphous silicon dioxide matrix, which is a good source of luminescence as discussed by L. Pavesi in Materials Today, 18 (2005) and P. M. Fauchet in Materials Today, 26 (2005). One can maximize carrier confinement, improves the radiative probability by quantum confinement, shifts the emission wavelength, controls the emission wavelength by the size of nanocrystalline and increase the luminescence efficiency by reducing the dielectric mismatch between the source material like nanocrystallites and the amorphous network, as carrier transport is easy in a-Si:H compared to oxide like $SiO_2$ barrier.

Inventors have grown nc-Si:H films by PECVD technique from Ar and hydrogen diluted silane using high RF power regime to what normally one does not prefer to use for the growth of device quality hydrogenated amorphous silicon and observed that the PL in these nc-Si:H films and their peak position can be shift by varying various process parameters like RF power, deposition pressure, gas feed ratio etc. Photoluminescence peak of these films is found to depend highly on argon dilution. It is also found that high dilution of argon favours photoluminescence at blue region, which is conserved highly desirable properties for future advancement of electronic devices like blue LEDs.

The following examples are given by way of illustration and therefore should not be construed to limit the scope of the present invention.

Example-1

In one deposition glass substrate (area ~100 cm$^2$) were cleaned by adopting RCA standard procedure and placed on the anode in the PECVD chamber and the chamber was pumped to a base pressure better than 10$^{-7}$ Torr. The substrates were heated to 200° C. The source gas silane (diluted in hydrogen) and the diluting gas argon were let into the chamber through mass flow controllers. The silane flow rate of 40 sccm and argon partial pressure of 35% were maintained for a period of 30 min during the process. The chamber pressure was maintained at 0.7 torr using baratron and throttle valve and their controllers. The radio frequency (13.56 MHz) discharge was created by applying the power density of ~200 mW/cm$^2$ to cathode. The film was deposited for 30 min at a rate of 0.21 A°/sec and for this film value of optical band gap was found to be 2.31 eV. There is photoluminescence in this film measured at room temperature.

Example-2

In another deposition TCO coated glass substrate (area ~100 cm$^2$) were cleaned by adopting RCA standard procedure and placed on the anode in the PECVD reactor and the reactor was pumped to a base pressure better than 10$^{-7}$ Torr. The substrate was heated to 200° C. The source gas silane (diluted in hydrogen) and the diluting gas argon were let into the reactor through mass flow controllers. The silane flow rate of 40 sccm and argon partial pressure of 35% were maintained for a period of 30 min during the process. The chamber pressure was maintained at 0.7 Torr using baratron and throttle valve and their controllers. The radio frequency (13.56 MHz) discharge was created by applying the power density of 200 mW/cm$^2$ to cathode. The film was deposited at same rate observed in example 1. There is photoluminescence in this film measured at room temperature.

Example-3

In another deposition 7059 glass and TCO coated glass (area ~50 cm$^2$ each) substrates were cleaned and placed on the anode in the PECVD reactor and the reactor was pumped to a base pressure better than 10$^{-7}$ torr. The substrates were heated to 200° C. The source gas silane (diluted in hydrogen) and the diluting gas argon were let into the reactor through mass flow controllers. The silane flow rate of 40 sccm and argon partial pressure of 35% were maintained for a period of 20 min during the process. The chamber pressure was maintained at 0.7 torr using baratron and throttle valve and their controllers. The radio frequency (13.56 MHz) discharge was created by applying the power density of 400 mW/cm$^2$ to cathode. The film was deposited for 20 min at a rate of 3.3 A°/sec and for this film value of optical band gap was found to be 2.29 eV. There is photoluminescence in this film measured at room temperature.

Example-4

In another deposition 7059 glass and TCO coated glass (area ~50 cm$^2$ each) substrates were cleaned by adopting RCA procedure and placed on the anode in the PECVD reactor and the reactor was pumped to a base pressure better than 10$^{-7}$ torr. The substrates were heated to 200° C. The source gas silane (diluted in hydrogen) and the diluting gas argon were let into the reactor through mass flow controllers. The silane flow rate of 40 sccm and argon partial pressure of 35% were maintained for a period of 20 min during the process. The chamber pressure was maintained at 0.6 torr using baratron and throttle valve and their controllers. The radio frequency (13.56 MHz) discharge was created by applying the power density of 600 mW/cm$^2$ to cathode. The film was deposited for a period of 20 min at rate of 3.1 A°/sec and for this film value of optical band gap was found to be 2:33 eV. The crystalline volume fraction in this film was found to be 26%. There is photoluminescence in this film measured at room temperature.

Example-5

In another deposition 7059 glass and TCO coated glass (area ~50 cm$^2$ each) substrates were cleaned by adopting RCA procedure and placed on the anode in the PECVD reactor and the reactor was pumped to a base pressure better than 10$^{-7}$ torr. The substrates were heated to 200° C. The source gas silane (diluted in hydrogen) and the diluting gas argon were let into the reactor through mass flow controllers. The silane flow rate of 40 sccm and argon partial pressure of 35% Torr were maintained for a period of 15 min during the process. The chamber pressure was maintained at 0.6 torr using baratron and throttle valve and their controllers. The radio frequency (13.56 MHz) discharge was created by applying the power density of 800 mW/cm$^2$ to cathode. The film was deposited for a period of 15 min at rate of 4.7 A°/sec and for this film value of optical band gap was found to be 2.48 eV. The crystalline volume fraction in this film was found to be 84%. There is photoluminescence this film measured at room temperature Example-6

In one deposition 7059 glass substrates (area ~100 cm$^2$) were cleaned by adopting RCA procedure and placed on the anode in the PECVD reactor and the reactor was pumped to a base pressure better than 10$^{-7}$ torr. The substrates were heated to 200° C. The source gas silane (diluted in hydrogen) and the diluting gas argon were let into the reactor through mass flow controllers. The silane flow rate of 40 sccm and argon partial pressure of 35% were maintained for a period of 10 min during the process. The chamber pressure was maintained at 0.7 torr using baratron and throttle valve and their controllers. The radio frequency (13.56 MHz) discharge was created by applying the power density of 1000 mW/cm$^2$ to cathode. The film was deposited for 10 min at rate of 5.6 A°/sec have optical band gap of 2.40 eV. The crystalline volume fraction in this film was found to be 73%. Photoluminescence was observed in the film and showed strong and broad emission peak at 569 nm (2.17 eV) with a bandwidth of 150 nm.

Example-7

In another deposition 7059 glass and TCO coated glass (area ~50 cm$^2$ each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was. The chamber pressure was maintained at 0.7 torr using baratron and throttle valve and their controllers. The radio frequency (13.56 MHz) discharge was created by applying the power density of 600 mW/cm² to cathode. In this deposition argon partial pressure was maintained to 50%. The radio frequency (13.56 MHz) discharge was created by applying the power 600 mW/cm². The film was deposited at rate of 2.3 A°/sec have optical band gap of 2.37 eV. There is photoluminescence in this film measured at room temperature.

Example-8

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 0.7 torr using baratron and throttle valve and their controllers. In this deposition argon partial pressure was maintained to 64%. The radio frequency (13.56 MHz) discharge was created by applying the power density of 600 mW/cm² to cathode. The film was deposited at rate of 4.44 A°/sec have optical band gap of 2.16 eV. Photoluminescence was observed at 419 nm (2.95 eV).

Example-9

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 0.7 torr using baratron and throttle valve and their controllers. The radio frequency (13.56 MHz) discharge was created by applying the power density of 600 mW/cm² to cathode. In this deposition argon partial pressure was maintained to 79%. The film was deposited at rate of 5.0 A°/sec have optical band gap of 2.18 eV. Photoluminescence was observed at 418 nm (2.96 eV).

Example-10

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 250° C. The source gas silane (diluted in hydrogen) and the diluting gas argon were let into the reactor through mass flow controllers. The silane flow rate of 40 sccm was maintained. The chamber pressure was maintained at 0.7 torr using baratron and throttle valve and their controllers. The radio frequency (13.56 MHz) discharge was created by applying the power density of 600 mW/cm² to cathode. In this deposition argon partial pressure was maintained to 93% Torr. The film was deposited at rate of 2.44 A°/sec have optical band gap of 2.47 eV. Photoluminescence was observed at 417 nm (2.97 eV).

Example-11

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 2 Torr using baratron and throttle valve and their controllers. The radio frequency (13.56 MHz) discharge was created by applying the power density of 600 mW/cm² to cathode. The film was deposited at a rate of 4.9 A°/sec have optical band gap of 2.66 eV. The crystalline volume fraction in this film was found to be 74%. Broad photoluminescence peaks were observed at 417 nm (2.97 eV) and 437 nm (2.83 eV).

Example-12

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 4 Torr using baratron and throttle valve and their controllers. The radio frequency (13.56 MHz) discharge was created by applying the power density of 600 mW/cm² to cathode. The film was deposited at rate of 2.06 A°/sec have optical band gap of 2.72 eV. The crystalline volume fraction in this film was found to be 80%. Broad Photoluminescence peaks were observed at 415 nm (2.98 eV) and 436 nm (2.84 eV).

Example-13

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 6 Torr using baratron and throttle valve and their controllers. The radio frequency (13.56 MHz) discharge was created by applying the power density of 600 mW/cm² to cathode. The film was deposited at rate of 1.61 A°/sec have optical band gap of 2.33 eV. The crystalline volume fraction in this film was found to be 42%. Broad photoluminescence peak was observed center at 428 nm (2.89 eV).

Example-14

In another deposition 7059 glass and TCO coated glass (area ~50 cm² each) substrates were cleaned by adopting RCA procedure and placed on the anode in the PECVD reactor and the reactor was pumped to a base pressure better than $10^{-7}$ torr. The substrates were heated to 200° C. The source gas silane (diluted in hydrogen) and the diluting gas argon were let into the reactor through mass flow controllers. The silane flow rate of 40 sccm was maintained. The chamber pressure was maintained at 8 Torr using baratron and throttle valve and their controllers. The radio frequency (13.56 MHz) discharge was created by applying the power density of 600 mW/cm$^2$ to cathode. The film was deposited at rate of 1.67 A°/sec have optical band gap of 2.21 eV. The crystalline-volume fraction in this film was found to be 30%. Broad photoluminescence peak was observed center at 425 nm (2.91 eV).

A novel deposition process has been developed for preparation of photoluminescent nanostructured silicon films using plasma enhanced chemical vapour deposition technique. Photo luminance in these films were observed at room temperature. Photo luminance in these films is accomplished through the appropriate selection of various process parameters such as power density, chamber pressure, gas flow rates, temperature etc. It was found that films deposited under a set of deposition process parameters were nanocrystalline in nature and shows photoluminance, which were grown using gaseous mixture of silane (SiH$_4$) diluted in hydrogen (H$_2$), and argon (Ar) in a radio frequency (13.56 MHz) plasma enhanced chemical vapour deposition system. Various process parameters such as power density, partial pressure, substrate temperature, and gas flow rate were varied and optimized to enhance the growth of nanocrystalline phases embedded in amorphous matrix of silicon. These films were characterized for structural properties using XRD, SEM, AFM and Laser Raman, techniques. Films were also characterized for estimation of optical bandgap and electrical conductivity. These films could be suitable for use in electroluminescence devices like light emitting diodes (LEDs), LASER etc.

The Main Advantages of the Present Invention are:
1. Photoluminescence has been shown in nanostructured silicon thin films deposited on low cost glass substrates using plasma enhanced chemical vapour deposition technique. This could be advantageous for integration of silicon photonic devices with the existing silicon microelectronic technology.
2. Possibility of precise control of the nanocrystal size of silicon and its uniform distribution using plasma processing for making of efficient light emission devices.

The invention claimed is:

1. A process for the preparation of photo luminescent nanostructured silicon thin films comprising the steps of:
  (i) cleaning a substrate and placing it on an anode in a plasma enhanced chemical vapour deposition (PECVD) chamber,
  (ii) pumping said PECVD chamber to a base pressure of $10^{-7}$ to $10^{-8}$ torr to remove the residual gases,
  (iii) heating the substrate at a temperature in the range of 180-250° C.,
  (iv) depositing the nanostructured silicon thin film over the substrate by feeding hydrogen diluted silane gas (SiH$_4$) at a rate of 30-50 standard cubic centimeter (sccm) and argon gas at a partial pressure of 30-90%, to said PECVD chamber, for a period of 10-60 minutes, at a chamber pressure of 0.5-10 torr,
  (v) applying a radio frequency of 13.56 MHz to a cathode in said PECVD chamber, at a power density of 100-1000 mW/cm$^2$ to achieve a depositing rate of thin silicon film over said substrate in the range of 1-5 A°/sec and
  (vi) cooling said PECVD chamber to a temperature of 25-30° C., followed by breaking of vacuum by inserting nitrogen gas to obtain the desired nano structured silicon film.

2. A process according to claim 1, wherein the substrate used in step (i) is selected from the group consisting of glass, silicon, transparent conducting oxides coated glass and metals.

3. A process according to claim 1, wherein the heating temperature is 200-220° C.

4. A process according to claim 1, wherein the hydrogen diluted silane used is in the range of 5-10% silane in hydrogen.

5. A process according to claim 1, wherein the rate of feeding of hydrogen diluted silane used in step (iv) is 38-42 sccm.

6. A process according to claim 1, wherein the partial pressure of argon gas used is 45-65%.

7. A process according to claim 1, wherein the chamber pressure used in step (iv) is 2-4 torr.

8. A process according to claim 1, wherein the power density used in step (v) is 750-850 mW/cm$^2$.

9. A process according to claim 1, wherein thin silicon film obtained has an average particle size distribution in the range of 5-20 nm.

10. A process according to claim 1, wherein the nanostructured silicon thin film obtained has a band gap and a photo luminescence in the range of 2-2.4 eV and 2.1-2.9 eV, respectively.

* * * * *